United States Patent
Chen et al.

(10) Patent No.: US 11,251,788 B2
(45) Date of Patent: Feb. 15, 2022

(54) DUTY CYCLE ADJUSTMENT APPARATUS

(71) Applicant: NO.24 RESEARCH INSTITUTE OF CHINA ELECTRONICS TECHNOLOGY GROUP CORPORATION, Chongqing (CN)

(72) Inventors: Xi Chen, Chongqing (CN); Liang Li, Chongqing (CN); Guangbing Chen, Chongqing (CN); Yuxin Wang, Chongqing (CN); Dongbing Fu, Chongqing (CN); Xingfa Huang, Chongqing (CN); Mingyuan Xu, Chongqing (CN); Xiaofeng Shen, Chongqing (CN)

(73) Assignee: NO.24 RESEARCH INSTITUTE OF CHINA ELECTRONICS TECHNOLOGY GROUP CORPORATION, Chongqing (CN)

( * ) Notice: Subject to any disclaimer, the term of this patent is extended or adjusted under 35 U.S.C. 154(b) by 0 days.

(21) Appl. No.: 16/082,066

(22) PCT Filed: Jul. 21, 2017

(86) PCT No.: PCT/CN2017/093815
§ 371 (c)(1),
(2) Date: Sep. 4, 2018

(87) PCT Pub. No.: WO2018/166130
PCT Pub. Date: Sep. 20, 2018

(65) Prior Publication Data
US 2021/0211122 A1    Jul. 8, 2021

(30) Foreign Application Priority Data
Mar. 17, 2017 (CN) .......................... 201710160683.0

(51) Int. Cl.
H03K 5/156 (2006.01)
H03L 7/089 (2006.01)

(52) U.S. Cl.
CPC .......... *H03K 5/1565* (2013.01); *H03L 7/089* (2013.01)

(58) Field of Classification Search
CPC ...... H03K 5/156; H03K 5/1565; H03L 7/085; H03L 7/089; H03L 7/0891; H03L 7/0893; H03L 7/0895; H03L 7/0896; H03L 7/0898
(Continued)

(56) References Cited

U.S. PATENT DOCUMENTS 5,912,572 A * 6/1999 Graf, III ................... H03L 7/00
327/144
6,690,217 B2 * 2/2004 Yoshikawa .......... H03K 5/1565
327/172

(Continued)

*Primary Examiner* — Diana J. Cheng
(74) *Attorney, Agent, or Firm* — Global IP Services; Tianhua Gu

(57) ABSTRACT

A duty cycle adjustment apparatus comprises a first edge extraction unit for extracting a rising edge of a first clock signal; a locking discrimination unit configured to output a control signal according to a comparison result between a discrimination voltage and a stabilized voltage, and select to connect the first clock signal or the clock output signal; an integration unit, configured to convert the feedback signal into the stabilized voltage, amplify the stabilized voltage to reach a reference voltage, and output a control voltage; a charge pump, configured to output a second clock signal according to the control voltage; a second edge extraction unit, configured to extract a falling edge of the second clock signal; and a phase discriminator, configured to compare a phase of the rising edge of the first clock signal with a phase of the falling edge of the second clock signal to generate the clock output signal.

9 Claims, 3 Drawing Sheets

(58) Field of Classification Search
USPC .................................................. 327/172, 175
See application file for complete search history.

(56) References Cited

U.S. PATENT DOCUMENTS

| | | | | |
|---|---|---|---|---|
| 6,853,225 | B2* | 2/2005 | Lee ........................ | H03K 5/151 |
| | | | | 327/158 |
| 8,638,153 | B2* | 1/2014 | Ge ........................... | G06F 1/04 |
| | | | | 327/291 |
| 2007/0296477 | A1* | 12/2007 | White ................... | H03L 7/0814 |
| | | | | 327/175 |
| 2009/0128207 | A1* | 5/2009 | Chang ...................... | G06F 1/06 |
| | | | | 327/175 |
| 2009/0279895 | A1* | 11/2009 | Takahara ................. | G06F 7/68 |
| | | | | 398/98 |
| 2014/0253195 | A1* | 9/2014 | Chandrasekaran .. | H03K 5/1565 |
| | | | | 327/175 |

* cited by examiner

DUTY CYCLE ADJUSTMENT APPARATUS

CROSS REFERENCE TO RELATED PATENT APPLICATION

The present application is the US national stage of PCT/CN2017/093815 filed on Jul. 21, 2017, which claims the priority of the Chinese patent application No. CN2017101606830 filed on Mar. 17, 2017, which application is incorporated herein by reference.

BACKGROUND OF THE PRESENT INVENTION

Field of Invention

The present invention belongs to the technical field of integrated circuit control, and particularly relates to a duty cycle adjustment apparatus and method with fast locking capacity, which are widely applied to a clock generating system for high-speed adjustment.

Description of Related Arts

In an integrated circuit system, a clock signal is used for synchronizing and stimulating operation of different modules, and its main parameters comprise a frequency, a phase, an amplitude, a jitter and a duty cycle. Wherein, the duty cycle is a ratio of a high level duration to a whole clock period. Wherein, a duty cycle adjustment apparatus is applied to a high-precision and high-speed system, such as a high-precision and high-speed Analog-to-Digital converter, core indexes thereof comprise an adjustable range, a jitter size and a locking speed.

In order to obtain a fast-locking duty cycle adjustment apparatus, the most direct method is to add a multistage driven loop gain. However, a large loop gain may cause a big clock jitter, which may restrict the overall performance of the system. There are two main types of indirect methods. For example, the document "A 500-MHz-1.25-GHz fast-locking pulse width control loop with presettable duty cycle" provides a fast-locking circuit implementation. By this method, a converter (voltage-difference-to-digital converter) module requires to be added to dynamically control a switched charge pump. Another type of method is as mentioned in the document "A fast lock time pulse width control loop using second order passive loop filters", in which a second order filter is used to convert a locked loop from an original first order system to a third order system, thereby obtaining a better locking time by using a position of a zero pole.

Although the first type of method can quickly lock the speed, the circuit implementation is complicated, and the area and the power consumption of the system are increased. The second type of method is relatively easy to implement and increases the area and the power consumption a little, but the capacity of increasing a locking speed is limited. Therefore, a duty cycle adjustment apparatus with simple circuit implementation, a proper locking speed, proper power consumption and a proper area is in urgent need in the high-precision and high-speed system.

SUMMARY OF THE PRESENT INVENTION

In view of the shortcomings of the above-mentioned prior art, an object of the present invention is to provide a duty cycle adjustment apparatus and method for solving problems on how to achieve effects of simple circuit implementation, a proper locking speed, proper power consumption and a proper area in the prior art.

In order to accomplish the above object and other relevant objects, the present invention provides a duty cycle adjustment apparatus, comprising: a first edge extraction unit, a locking discrimination unit, an integration unit, a charge pump, a second edge extraction unit and a phase discriminator.

The first edge extraction unit is configured to input a first clock signal, and extract a rising edge of the input first clock signal.

The locking discrimination unit is configured to input the first clock signal and a clock output signal output by the phase discriminator, and output a corresponding control signal according to a comparison result between a discrimination voltage and a stabilized voltage, and connect the first clock signal or the clock output signal as a feedback signal according to the control signal.

The integration unit is configured to convert the feedback signal into the stabilized voltage, amplify the stabilized voltage till a reference voltage, and output a control voltage.

The charge pump is configured to output a second clock signal according to the control voltage.

The second edge extraction unit is configured to extract a falling edge of the second clock signal.

The phase discriminator is configured to compare a phase of the rising edge of the first clock signal with a phase of the falling edge of the second clock signal to generate the clock output signal corresponding to a required duty cycle.

Another object of the present invention is to provide a duty cycle adjustment method, including:

extracting a rising edge of an input first clock signal;

outputting a corresponding control signal according to a comparison result between a discrimination voltage and a stabilized voltage, and connecting the first clock signal or a clock output signal as a feedback signal according to the control signal;

converting the feedback signal into the stabilized voltage, amplifying the stabilized voltage till a reference voltage, and outputting a control voltage;

outputting a second clock signal according to the control voltage;

extracting a falling edge of the second clock signal; and comparing a phase of the rising edge of the first clock signal with a phase of the falling edge of the second clock signal to generate a clock output signal corresponding to a required duty cycle.

As mentioned above, the duty cycle adjustment apparatus and method consistent with the present invention have the following beneficial effects:

firstly, the present invention is implemented on the basis of an RC integrator, and is a duty cycle adjustment circuit of a closed-loop structure; compared with a duty cycle adjustment circuit implemented by a delay line, this duty cycle adjustment circuit is more sensitive to a frequency variation of an input clock; and when the frequency of the input clock varies, no locking error is caused;

secondly, a fast locking principle in the present invention is that the input clock is used as the feedback signal under a specific condition to maintain the control signal increasing at a constant slope, but only one discrimination circuit and one MUX circuit are added in the aspect of circuit implementation, so that the implementation is easy, and the area and the power consumption are increased a little; and thirdly, after the locking discrimination unit of the present invention is started, the locking time may be at least saved by 30% to 60% compared with the locking time of the conventional duty cycle adjustment apparatus.

Figure 1:
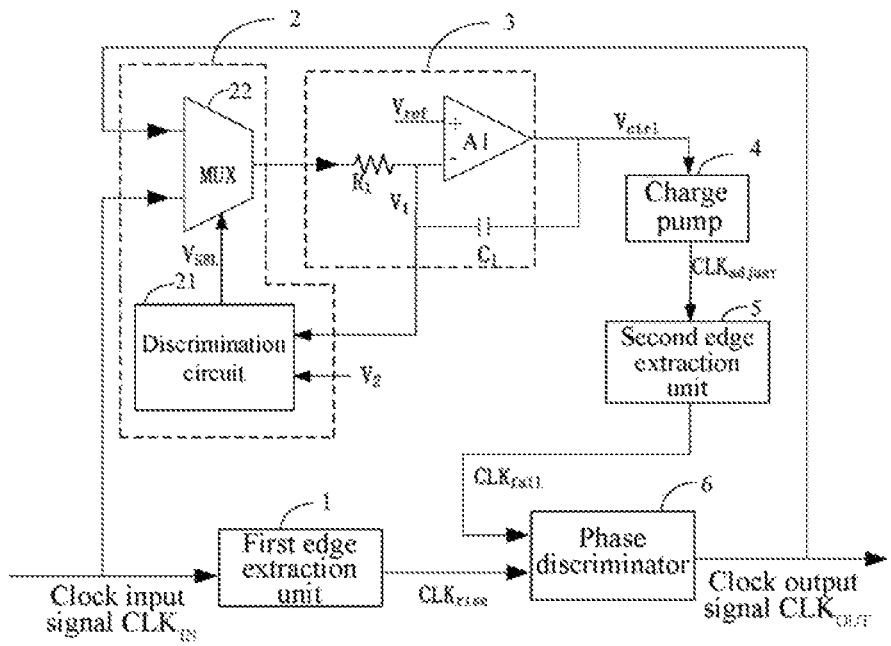
FIG. 1 is a structural block diagram of a duty cycle adjustment apparatus provided in the present invention.

DESCRIPTION OF COMPONENT NUMERALS 1 first edge extraction unit
2 locking discrimination unit
3 integration unit
4 charge pump
5 second edge extraction unit
6 phase discriminator
21 multiplexer
22 discrimination circuit

DETAILED DESCRIPTION OF THE PREFERRED EMBODIMENTS

Implementation modes of the present invention are described below through specific examples. Those skilled in the art can easily understand other advantages and effects of the present invention according to contents disclosed by this description. The present invention may be further implemented or applied through other different specific implementation modes. Various modifications or changes also may be made to all details in this description without departing from the spirit of the present invention based on different opinions and applications. It should be noted that in the absence of conflicts, the following embodiments and features in the embodiments may be combined mutually.

It should be noted that drawings provided in the following embodiments only describe the basic concept of the present invention schematically, so that the drawings only display assemblies related to the present invention instead of being drawn according to the number, shapes and sizes of the assemblies during actual implementation. During actual implementation, the forms, the number and the proportions of all the assemblies may be randomly changed, and a layout type of the assemblies may be more complicated.

Please refer to FIG. 1, the present invention provides a structural block diagram of a duty cycle adjustment apparatus, comprising:

a first edge extraction unit 1, through which a first clock signal is input, configured to extract a rising edge of the input first clock signal;

a locking discrimination unit 2, through which the first clock signal and a clock output signal which is output by a phase discriminator are input, configured to output a corresponding control signal according to a comparison result between a discrimination voltage and a stabilized voltage, and connect the first clock signal or a clock output signal as a feedback signal according to the control signal;

an integration unit 3, configured to convert the feedback signal into the stabilized voltage, amplify the stabilized voltage till a reference voltage, and output a control voltage, wherein a ratio value of the reference voltage $V_{ref}$ to $(V_{DD}+V_{GND})$ determines the size of a duty cycle of an output clock signal $CLK_{out}$ of a circuit consistent with the present invention; by taking a duty cycle of 50 percent for example, $V_{ref}=(V_{DD}+V_{GND})/2$, wherein $V_{DD}$ is a power voltage, and $V_{GND}$ is a power ground;

a charge pump 4, configured to output a second clock signal according to the control voltage;

a second edge extraction unit 5, configured to extract a falling edge of the second clock signal; and a phase discriminator 6, configured to compare a phase of the rising edge of the first clock signal with a phase of the falling edge of the second clock signal to generate a clock output signal corresponding to a required duty cycle.

Wherein, the first and second edge extraction units are conventional edge extraction circuits. The charge pump 4 adopts a conventional charge pump circuit. The phase discriminator 6 adopts a conventional phase discriminator circuit.

In the present embodiment, the locking discrimination unit 2 takes a clock input signal $CLK_{IN}$ as an initial feedback signal. The integration unit 3 continuously charges the stabilized voltage along with accumulation of a time period to enable the stabilized voltage to gradually approximate to the reference voltage $V_{ref}$ to output the control voltage $V_{ctrl}$. The control voltage Vern enters a fast locking region from a constant low voltage before locking, then quickly accumulates and rises to a certain voltage value, and enters a conventional locking region. The control voltage $V_{ctrl}$ rises slowly till it enters the locking region and is kept at a constant voltage value to respectively extract the falling edge $CLK_{fall}$ of the constant value $CLK_{adjust}$ and the rising edge $CLK_{rise}$ of the first clock signal. The phase discriminator is used for outputting the clock output signal $CLK_{out}$ with an accurate required duty cycle. By mutual cooperation of the integration unit and the locking unit, the locking efficiency is improved, and the locking time is saved.

In addition, in the present embodiment, the integration unit 3 comprises an operational amplifier, a first resistor R1 and a first capacitor C1. One end of the first resistor R1 is connected to an output end of a multiplexing circuit 22, and the other end of the first resistor R1 is connected to one end of the first capacitor R1, a negative input end of the operational amplifier and an input end of the locking discrimination unit (i.e. the discrimination circuit 21 therein). A positive input end of the operational amplifier is connected to the reference voltage $V_{ref}$. The other end of the first capacitor C1 is connected to an output end of the operational amplifier to output the control voltage $V_{ctrl}$. The present invention is implemented on the basis of an RC integrator, and is a duty cycle adjustment circuit of a closed-loop structure. Compared with a duty cycle adjustment circuit implemented by a delay line, this duty cycle adjustment circuit is more sensitive to a frequency variation of an input clock. When the frequency of the input clock varies, no locking error is caused.

Figure 2:
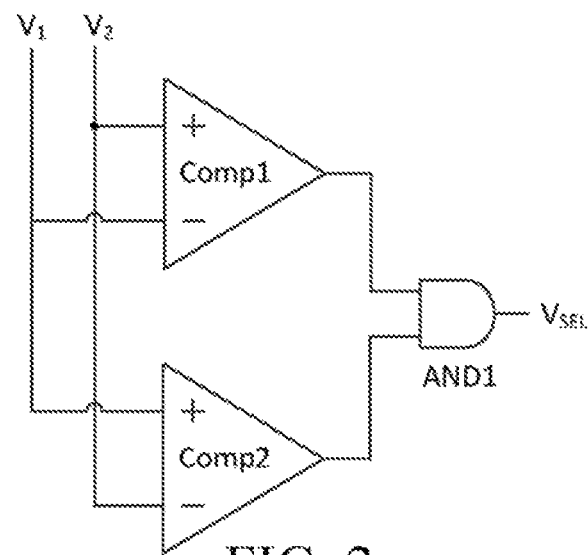
FIG. 2 is a circuit diagram of a locking discrimination unit in a duty cycle adjustment apparatus provided in the present invention.

As shown in FIG. 2, it is a circuit diagram of a discrimination circuit in a duty cycle adjustment apparatus provided in the present invention. Details are described below:

The locking discrimination unit 2 comprises a multiplexing circuit 22 and a discrimination circuit 21. The discrimination circuit 21 is configured to output the control signal according to the comparison result between the discrimination voltage and the stabilized voltage. An input end of the multiplexing circuit 22 is connected to the clock input signal and the clock output signal which is output by the phase discriminator respectively, and is configured to connect the clock input signal or the clock output signal as the feedback signal under the stimulation of the control signal to output the control signal. Wherein the control signal is at a high level or a low level.

Specifically, the multiplexing circuit 22 is a circuit multiplexer. In the present application, a two-way selector is preferred, namely a data selector with an input end switched on in an alternative manner.

Wherein, the discrimination circuit 21 comprises a first comparator COMP1, a second comparator COMP2 and an AND gate AND1. A positive input end of the first comparator COMP1 is connected to a discrimination voltage $V_2$, and a negative input end of the first comparator COMP1 is connected to a stabilized voltage $V_1$. A positive input end of the second comparator COMP2 is connected to the stabilized voltage $V_1$, and a negative input end of the second comparator COMP2 is connected to the discrimination voltage $V_2$. An input end of the AND gate AND1 is connected to output ends of the first comparator COMP1 and the second comparator COMP2 respectively to output a control signal $V_{SEL}$ of AND operation.

Specifically, the first comparator COMP1 and the second comparator COMP2 are both conventional hysteresis comparator circuits, and the AND gate AND1 is a conventional AND logic gate circuit.

Figure 3:
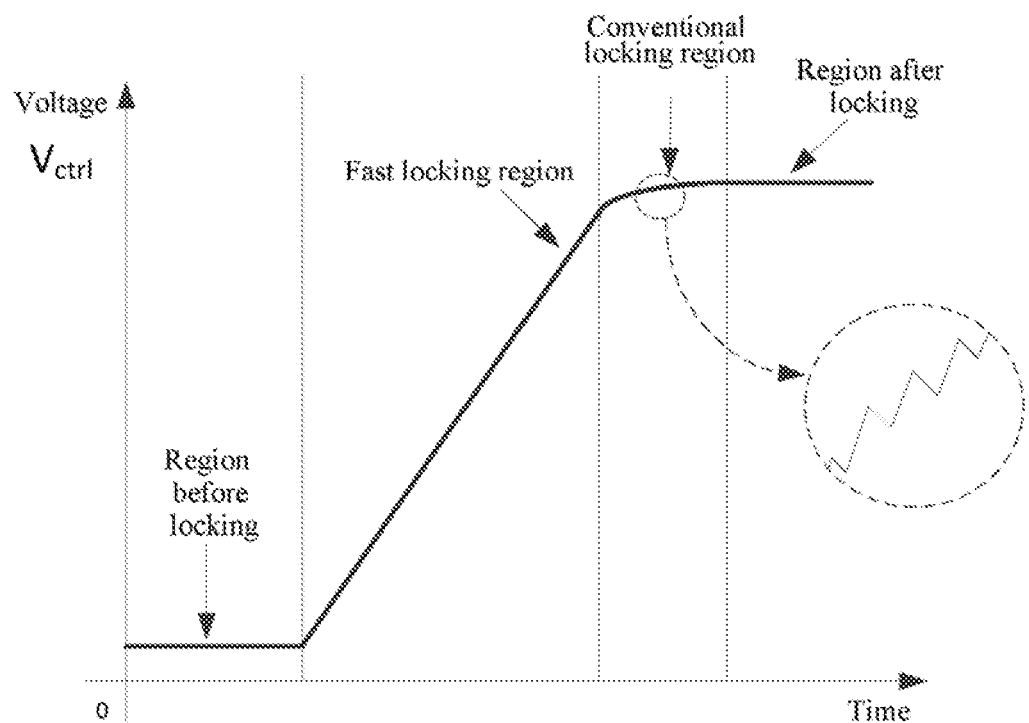
FIG. 3 is an instantaneous response diagram of a control voltage $V_{ctrl}$ of a charge pump of a duty cycle adjustment apparatus provided in the present invention.

As shown in FIG. 3, it is an instantaneous response diagram of a control voltage $V_{ctrl}$ of a charge pump of the duty cycle adjustment apparatus provided in the present invention. Details are described below:

Wherein, the control voltage $V_{ctrl}$ includes four operation processes. Firstly, before locking is started, the control voltage $V_{ctrl}$ is kept at a constant low voltage. Secondly, after the duty cycle adjustment apparatus starts to work, the control voltage $V_{ctrl}$ enters a fast locking region, then quickly accumulates and rises to a certain voltage value, and enters a conventional locking region. Thirdly, in the conventional locking region, the control voltage $V_{ctrl}$ rises slowly till it finally enters a locking region. Fourthly, the control voltage $V_{ctrl}$ is in a locking state to keep a constant value.

In the present embodiment, the control voltage $V_{ctrl}$ is kept increasing in a constant slope manner mainly through the second process. After the locking discrimination unit is started, the locking time may be at least saved by 30% to 60% compared with the locking time of the conventional duty cycle adjustment apparatus.

Figure 4:
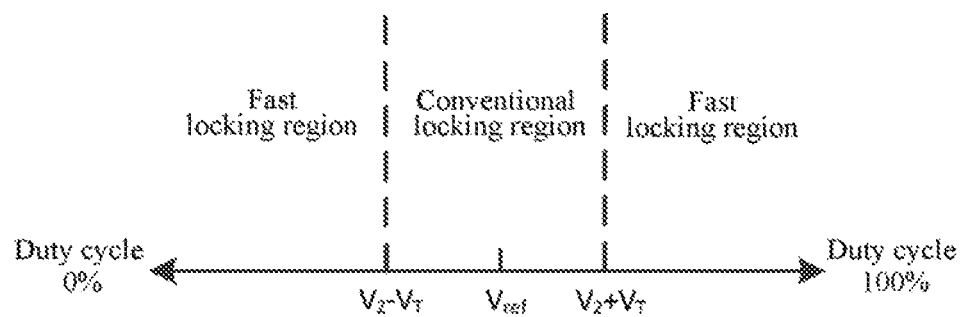
FIG. 4 is a diagram of a relation among a control voltage, a locking region and a duty cycle in a duty cycle adjustment apparatus provided in the present invention.

As shown in FIG. 4, it is a diagram of a relation among a control voltage, a locking region and a duty cycle in a duty cycle adjustment apparatus provided in the present invention. Details are described below:

The discrimination voltage $V_2$ and hysteresis voltages $V_T$ of the comparators (the first comparator and the second comparator) jointly determine whether the control voltage $V_{ctrl}$ enters the fast locking region or the conventional locking region. When the voltage $V_1$ of the positive input end of the operational amplifier A1 is equal to $V_{ref}$, it means that the required duty cycle is realized and a system is locked. When $V_1$ is within the region ($V_2-V_T$, $V_2+V_T$), the control voltage $V_{ctrl}$ is slowly accumulated at a conventional locking speed. When $V_1$ is beyond the region ($V_2-V_T$, $V_2+V_T$), the control voltage $V_{ctrl}$ is accumulated at a fast locking speed.

The fast locking discrimination circuit completes the above-mentioned functions, as further described below:

When $V_1$ is within the region ($V_2-V_T$, $V_2+V_T$), the first comparator and the second comparator both output a logic "1", which passes through the AND logic gate to obtain a control signal $V_{SEL}$="1".

When $V_1$ is beyond the region ($V_2-V_T$, $V_2+V_T$), the first comparator and the second comparator respectively output logics "1" and "0", which pass through the AND logic gate to obtain a control signal $V_{SEL}$="0".

When the control signal $V_{SEL}$="0", the MUX circuit selects the input clock $CLK_{IN}$ as a feedback signal to connect to one end of the resistor $R_1$.

When the control signal $V_{SEL}$="1", the MUX circuit selects the output clock $CLK_{out}$ as a feedback signal to connect to one end of the resistor $R_1$.

When the MUX circuit is initially powered on, the clock $CLK_{IN}$ is selected as a feedback signal to connect to one end of the resistor R1 for the first time in default.

A fast locking principle in the present invention is that the input clock is used as the feedback signal under a specific condition to maintain the control signal increasing at a constant slope, but only one discrimination circuit and one MUX circuit are added in the aspect of circuit implementation, so that the implementation is easy, and the area and the power consumption are increased a little.

By taking a situation that the duty cycle of the clock input signal $CLK_{IN}$ is 90%, hoping that the duty cycle of the clock output signal $CLK_{out}$ is 50% as example, a difference between the working principle of the present invention and the working principle of a conventional structure is further described.

For the conventional structure, after the first feedback, it can be roughly thought that a variation value of the control voltage $V_{ctrl}$ of the charge pump is 0.9I–0.1I=0.8I, wherein I is a magnitude of a charging and discharging current.

It is assumed that after the second feedback, the duty cycle becomes 80%, so that a variation value of the control voltage $V_{ctrl}$ of the charge pump is 0.8I–0.2I=0.6I.

After the above process is repeated for n times till the duty cycle is equal to 50%, a variation value of the control voltage $V_{ctrl}$ of the charge pump is 0.5I–0.5I=0, which is kept being locked and unchanged.

As shown in FIG. 3, in the conventional region, the variation value of the control voltage $V_{ctrl}$ of the charge pump is continuously decreased as the duty cycle approximates to a target value. A varying rule of the increasing amplitude of the variation value is represented as a curve, with a continuously decreased slope.

According to the duty cycle adjustment apparatus consistent with the present invention, after the first feedback, the variation value of the control voltage $V_{ctrl}$ of the charge pump is 0.9I–0.1I=0.8I.

After the second feedback, the duty cycle becomes 80%, but by virtue of the fast locking discrimination circuit, it is the input clock signal $CLK_{IN}$ that is actually fed back and connected to one end of the resistor R1, and the variation of the control voltage $V_{ctrl}$ of the charge pump is 0.9I–0.1I=0.8I.

Based on this, the variation value of the control voltage $V_{ctrl}$ of the charge pump is always 0.8I.

It is assumed again that a specific corresponding value of the region ($V_2-V_T$, $V_2+V_T$) is (45%, 55%).

After the above process is repeated for n times till the duty cycle is equal to 45%, the feedback signal connected to one end of the resistor R1 becomes $CLK_{OUT}$, and the variation value of the control voltage $V_{ctrl}$ of the charge pump is 0.55I−0.45I=0.1I.

Hereafter, according to a conventional method, the control voltage $V_{ctrl}$ of the charge pump starts to increase slowly till it is locked and unchanged.

Similarly, it also can be selected that the duty cycle of the clock input signal $CLK_{IN}$ is 20%, hoping that the duty cycle of the clock output signal $CLK_{OUT}$ is 50%. However the variation value of the control voltage $V_{ctrl}$ of the charge pump is continuously increasing as the duty cycle approximates to a target value. A varying rule of the increasing amplitude of the variation is represented as a curve. This process is opposite to the above-mentioned process, so that the descriptions thereof are omitted herein. It can be obviously seen through the above comparison that after the fast locking circuit is added in the present invention, a locking speed of the control voltage $V_{ctrl}$ of the charge pump is obviously increased. A varying rule of the increasing amplitude of the locking speed is a represented as a straight line, with an unchanged slope.

Figure 5:
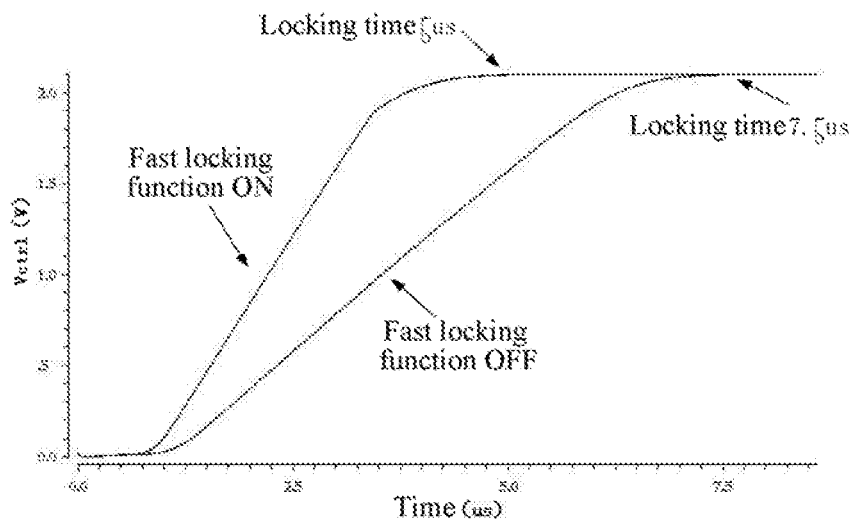
FIG. 5 is a comparison diagram of a simulation result of a control voltage $V_{ctrl}$ of a charge pump of a duty cycle adjustment apparatus provided in the present invention.

As shown in FIG. 5, it is a comparison diagram of a simulation result of the control voltage $V_{ctrl}$ of the charge pump in a state that the fast locking circuit is turned on/off. In this simulation, the input clock signal is 200 MHz, and its initial duty cycle is 70%. When the fast locking circuit is turned on, the control voltage $V_{ctrl}$ reaches a constant value $2_V$, the required locking time thereof is 5 us. In the off state, the control voltage $V_{ctrl}$ reaches the constant value $2_V$, the required locking time is 7.5 us. Relatively speaking, the locking speed is increased by 50%. In addition, a clock input signal $CLK_{IN}$ with a higher initial duty cycle is selected, and is adjusted to be a clock output signal $CLK_{OUT}$ with a relatively low duty cycle. For example, when the initial duty cycle is 90%, the clock input signal $CLK_{IN}$ is adjusted to be a clock output signal $CLK_{OUT}$ with a duty cycle of 10%. Compared with the original method, this method can save more locking time and achieve an effect of improving the locking efficiency by 60 percent, and the descriptions thereof are omitted herein.

Figure 6:
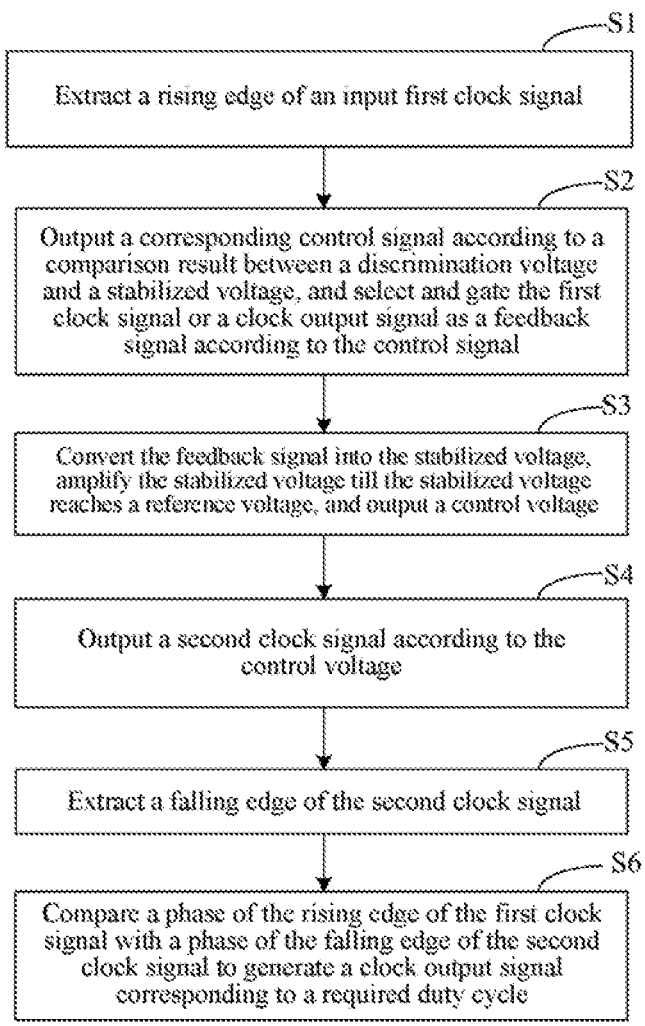
FIG. 6 is a flowchart of a duty cycle adjustment method provided in the present invention.

As shown in FIG. 6, it is a flowchart of a duty cycle adjustment method provided in the present invention, comprising:

Step S1, extracting a rising edge of an input first clock signal.

Specifically, a duty cycle of an output clock signal $CLK_{OUT}$ in the present invention is set by adjusting a ratio of a reference voltage $V_{ref}$ to $(V_{DD}+V_{GND})$.

Step S2, outputting a corresponding control signal according to a comparison result between a discrimination voltage and a stabilized voltage, connecting the first clock signal or a clock output signal as a feedback signal according to the control signal.

Specifically, positive input end and negative input end of a first comparator are respectively connected to the discrimination voltage and the stabilized voltage to output a first comparison signal;

positive input end and negative input end of a second comparator are respectively connected to the stabilized voltage and the discrimination voltage to output a second comparison signal;

the first comparison signal and the second comparison signal are subjected to AND operation to output the control signal, wherein the control signal is at a high level or a low level; and connecting the first clock signal or the clock output signal as the feedback signal according to the high level or the low level output by the control signal;

Step S3, converting the feedback signal into the stabilized voltage, amplifying the stabilized voltage till a reference voltage, and outputting a control voltage.

Specifically, a first resistor in an integration unit is used for converting the feedback signal into the stabilized voltage; a first capacitor of a negative feedback in the integration unit charges and amplifies the stabilized voltage; when the stabilized voltage is amplified to be equal to the reference voltage, the stabilized voltage is locked to output the control voltage.

Step S4, outputting a second clock signal according to the control voltage.

Specifically, the second clock signal is output by using a charge pump according to the control voltage used as a stimulation.

Step S5, extracting a falling edge of the second clock signal.

Specifically, the falling edge of the second clock signal is extracted by adopting a clock extraction circuit;

Step S6, comparing a phase of the rising edge of the first clock signal with a phase of the falling edge of the second clock signal to generate a clock output signal corresponding to a required duty cycle.

In the present embodiment, by using the above-mentioned duty cycle adjustment apparatus, the clock output signal $CLK_{OUT}$ with the required duty cycle may be quickly output as well, and the descriptions thereof are omitted herein.

In conclusion, the present invention is implemented on the basis of the RC integrator, and is the duty cycle adjustment circuit of the closed-loop structure. Compared with the duty cycle adjustment circuit implemented by the delay line, this duty cycle adjustment circuit is more sensitive to the frequency variation of the input clock. When the frequency of the input clock varies, no locking error is caused. After the locking discrimination unit of the present invention is started, the locking time may be at least saved by 30 to 60% compared with the locking time of the conventional duty cycle adjustment apparatus. Therefore, the present invention effectively overcomes various shortcomings in the prior art and has high industrial utilization value.

The above-described embodiments merely illustrate the principles and effects of the present disclosure, but are not intended to limit the present disclosure. Any person skilled in the art can modify or change the above embodiments without departing from the spirit and scope of the present disclosure. Therefore, all equivalent modifications or changes made by persons of ordinary skill in the art without departing from the spirit and technical thought disclosed in the present disclosure shall still be covered by the claims of the present disclosure.

What is claimed is:

1. A duty cycle adjustment apparatus, comprising: a first edge extraction unit, a locking discrimination unit, an integration unit, a charge pump, a second edge extraction unit and a phase discriminator; wherein the first edge extraction unit is configured to input a first clock signal, and extract a rising edge of the input first clock signal;

the locking discrimination unit is configured to input the first clock signal and a clock output signal output by the phase discriminator, and output a corresponding control signal according to a comparison result between a discrimination voltage and a stabilized voltage, and connect the first clock signal or the clock output signal as a feedback signal according to the control signal;

the integration unit is configured to convert the feedback signal into the stabilized voltage, amplify the stabilized voltage until a reference voltage is reached, and output a control voltage;

the charge pump is configured to output a second clock signal according to the control voltage;

the second edge extraction unit is configured to extract a falling edge of the second clock signal; and the phase discriminator is configured to compare a phase of the rising edge of the first clock signal with a phase of the falling edge of the second clock signal to generate a clock output signal corresponding to a required duty cycle.

2. The duty cycle adjustment apparatus as in claim 1, wherein the locking discrimination unit comprises a multiplexing circuit and a discrimination circuit; the discrimination circuit is configured to output the control signal according to the comparison result between the discrimination voltage and the stabilized voltage; an input end of the multiplexing circuit is connected to the clock input signal and the clock output signal which is output by the phase discriminator respectively, and is configured to connect the clock input signal or the clock output signal as the feedback signal under the stimulation of the control signal to output the control signal; wherein the control signal is at a high level or a low level.

3. The duty cycle adjustment apparatus as in claim 2, wherein the discrimination circuit comprises a first comparator, a second comparator and an AND gate; a positive input end of the first comparator is connected to the discrimination voltage, and a negative input end of the first comparator is connected to the stabilized voltage; a positive input end of the second comparator is connected to the stabilized voltage, and a negative input end of the second comparator is connected to the discrimination voltage; and an input end of the AND gate is connected to output ends of the first comparator and the second comparator respectively to output a control signal of AND operation.

4. The duty cycle adjustment apparatus as in claim 2, wherein the multiplexing circuit is a circuit multiplexer.

5. The duty cycle adjustment apparatus as in claim 1, wherein the integration unit comprises an operational amplifier, a first resistor and a first capacitor; one end of the first resistor is connected to an output end of the multiplexing circuit, and the other end of the first resistor is connected to one end of the first capacitor, a negative input end of the operational amplifier and an input end of the locking discrimination unit respectively; a positive input end of the operational amplifier is connected to the reference voltage; and the other end of the first capacitor is connected to an output end of the operational amplifier to output the control voltage.

6. A duty cycle adjustment method, comprising the following steps:

extracting a rising edge of an input first clock signal;

outputting a corresponding control signal according to a comparison result between a discrimination voltage and a stabilized voltage, and connecting the first clock signal or a clock output signal as a feedback signal according to the control signal;

converting the feedback signal into the stabilized voltage, amplifying the stabilized voltage until a reference voltage is reached, and outputting a control voltage;

outputting a second clock signal according to the control voltage;

extracting a falling edge of the second clock signal; and comparing a phase of the rising edge of the first clock signal with a phase of the falling edge of the second clock signal to generate a clock output signal corresponding to a required duty cycle.

7. The duty cycle adjustment method as in claim 6, wherein outputting the control signal according to the comparison result between the discrimination voltage and the stabilized voltage comprises:

respectively connecting positive input end and negative input end of a first comparator to the discrimination voltage and the stabilized voltage to output a first comparison signal;

respectively connecting positive input end and negative input end of a second comparator to the stabilized voltage and the discrimination voltage to output a second comparison signal; and performing AND operation on the first comparison signal and the second comparison signal to output the control signal, wherein the control signal is at a high level or a low level.

8. The duty cycle adjustment method as in claim 6, wherein connecting the first clock signal or the clock output signal as the feedback signal according to the control signal comprises:

connecting the first clock signal or the clock output signal as the feedback signal according to the high level or the low level output by the control signal.

9. The duty cycle adjustment method as in claim 6, wherein converting the feedback signal into the stabilized voltage, amplifying the stabilized voltage until the reference voltage is reached, and outputting the control voltage comprises:

converting the feedback signal into the stabilized voltage by using a first resistor in an integration unit; amplifying the stabilized voltage by charging a first capacitor in the integration unit; and locking the stabilized voltage to output the control voltage when the stabilized voltage reaching the reference voltage.

\* \* \* \* \*